(12) United States Patent
Zhang et al.

(10) Patent No.: US 8,902,094 B1
(45) Date of Patent: Dec. 2, 2014

(54) CLOCK GENERATOR FOR USE IN A TIME-INTERLEAVED ADC AND METHODS FOR USE THEREWITH

(71) Applicant: Broadcom Corporation, Irvine, CA (US)

(72) Inventors: Heng Zhang, Irvine, CA (US); Delong Cui, Irvine, CA (US); Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/087,457

(22) Filed: Nov. 22, 2013

Related U.S. Application Data

(60) Provisional application No. 61/901,653, filed on Nov. 8, 2013.

(51) Int. Cl.

| | | |
|---|---|---|
| *H03M 1/00* | (2006.01) | |
| *H03M 1/08* | (2006.01) | |
| *H03M 1/50* | (2006.01) | |
| *H03M 1/12* | (2006.01) | |
| *H03L 7/081* | (2006.01) | |
| *H04L 7/00* | (2006.01) | |
| *H03K 5/135* | (2006.01) | |
| *H03L 7/089* | (2006.01) | |

(52) U.S. Cl.
CPC *H03M 1/08* (2013.01); *H03M 1/50* (2013.01); *H03M 1/1245* (2013.01); *H03M 1/12* (2013.01); *H03L 7/0812* (2013.01); *H03L 7/0814* (2013.01); *H04L 7/0008* (2013.01); *H03K 5/135* (2013.01); *H03M 1/00* (2013.01); *H03L 7/0891* (2013.01)
USPC .......................................... 341/122; 341/158

(58) Field of Classification Search
CPC ....... H03M 1/12; H03M 1/00; H03M 1/1245; H03L 7/0812; H03L 7/0814; H03L 7/0891; H04L 7/008; H03K 5/135
USPC .......... 341/122, 155, 158; 327/156, 158, 155, 327/149; 375/354
See application file for complete search history.

(56) References Cited

U.S. PATENT DOCUMENTS 7,646,323 B2 * 1/2010 Pickering ...................... 341/158

* cited by examiner

*Primary Examiner* — Joseph Lauture
(74) *Attorney, Agent, or Firm* — Garlick & Markison; Bruce E. Stuckman

(57) ABSTRACT

A first clock generator receives an input clock, generates a first clock signal for use in a first level of a multilevel track and hold circuit of a time-interleaved analog to digital convertor, and generates a time-leading version of the first clock signal. A plurality of second clock generators receive the input clock and generate a corresponding plurality of second clock signals for use in a second level of the multi-level track and hold circuit. The plurality of second level clock generators include an adjustable delay that delays a corresponding one of the plurality of second clock signals by a delay amount that is determined based on a delay control signal. A feedback controller generates the delay control signal based on the time-leading version of the first clock signal and further based on the corresponding one of the plurality of second clock signals.

20 Claims, 9 Drawing Sheets

US 8,902,094 B1

CLOCK GENERATOR FOR USE IN A TIME-INTERLEAVED ADC AND METHODS FOR USE THEREWITH

CROSS REFERENCE TO RELATED PATENTS

The present application claims priority under 35 U.S.C. 119(e) to the provisionally filed application entitled CLOCK GENERATOR FOR USE IN A TIME-INTERLEAVED ADC AND METHODS FOR USE THEREWITH, having Ser. No. 61/901,653, filed on Nov. 8, 2013, the contents of which are expressly incorporated herein by reference in their entirety for any and all purposes.

TECHNICAL FIELD

The present application relates to time-interleaved analog to digital converters and clock signal generators for use therewith and related methods.

DESCRIPTION OF RELATED ART

As is known, integrated circuits are used in a wide variety of electronic equipment, including communication devices. Such devices include access points, routers, gateways, terminals, switches, modems, base stations, personal computers, smart phones, tablets and/or other devices that engage in communication either wirelessly or on a wired basis via a network or a plurality of networks. Each of these communication devices includes one or more integrated circuits to provide the functionality of the device. Such integrated circuits include analog to digital converters that convert analog signals into digital data signals for processing.

One concern in the design of analog to digital converters is the amount of noise that is produced. It is desirable for the noise of these circuits to be as low as possible. Analog to digital converters operate based on one or more clock signals. Jitter in these clock signals can degrade the noise performance of the device.

DETAILED DESCRIPTION

Figure 1:
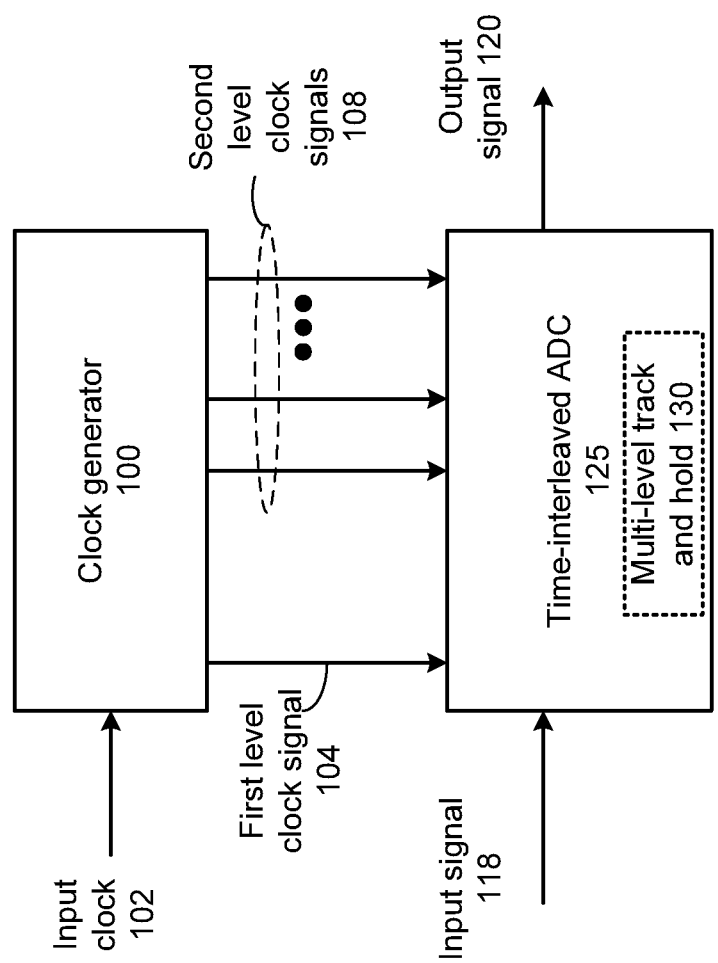
FIG. 1 presents a block diagram of an exemplary time-interleaved analog to digital convertor and clock generator.

FIG. 1 presents a block diagram of an exemplary time-interleaved analog to digital convertor and clock generator. A time-interleaved analog to digital convertor (ADC) 125 is presented that receives an analog input signal 118 and generates a digital output signal 120 in response thereto. Commercial devices are demanding higher speed and higher resolution for ADCs. Time-interleaved ADCs support this goal by interleaving branches of lower-speed sub-ADCs to achieve a higher aggregated speed. Increasingly large interleaving factors are being deployed.

In particular, the time-interleaved ADC 125 includes a multi-level track and hold 130 having at least a first level and a second level of track and hold (e.g. sample and hold) operation. Solid ADC performance depends on a low jitter, and a robust clocking scheme. In particular, multiple clocks need to be generated in a time-interleaved ADC. The clock generator 100 generates a first level clock signal 104 for clocking the first level of the multi-level track and hold 130. The clock generator 130 also generates and a plurality of second level clock signals 108 for clocking the second level of the multi-level track and hold 130.

The first-level clock signal 104 should maintain low jitter to minimize degradation on ADC SNDR. While the second-level clock signals 108 do not require low jitter since the signal is already "frozen" by sampling at the first level, the second level clock signals should be non-overlap with the first-level clock signal 104. The brute-force way to maintain non-overlap relationship between the two clock paths usually involves shortening the sampling window of the sub-ADCs. However, higher interleaving factors and higher speeds shrink allowable timing margins and limit scalability. Clock generator 100 operates based on timing feedback to dynamically control the second level clock signals 108 to avoid overlap with the first level clock signal 104.

Various embodiments of the time-interleaved ADC 125 and clock generator 100, that include several optional functions and features, are presented in conjunction with FIGS. 2-9 that follow.

Figure 2:
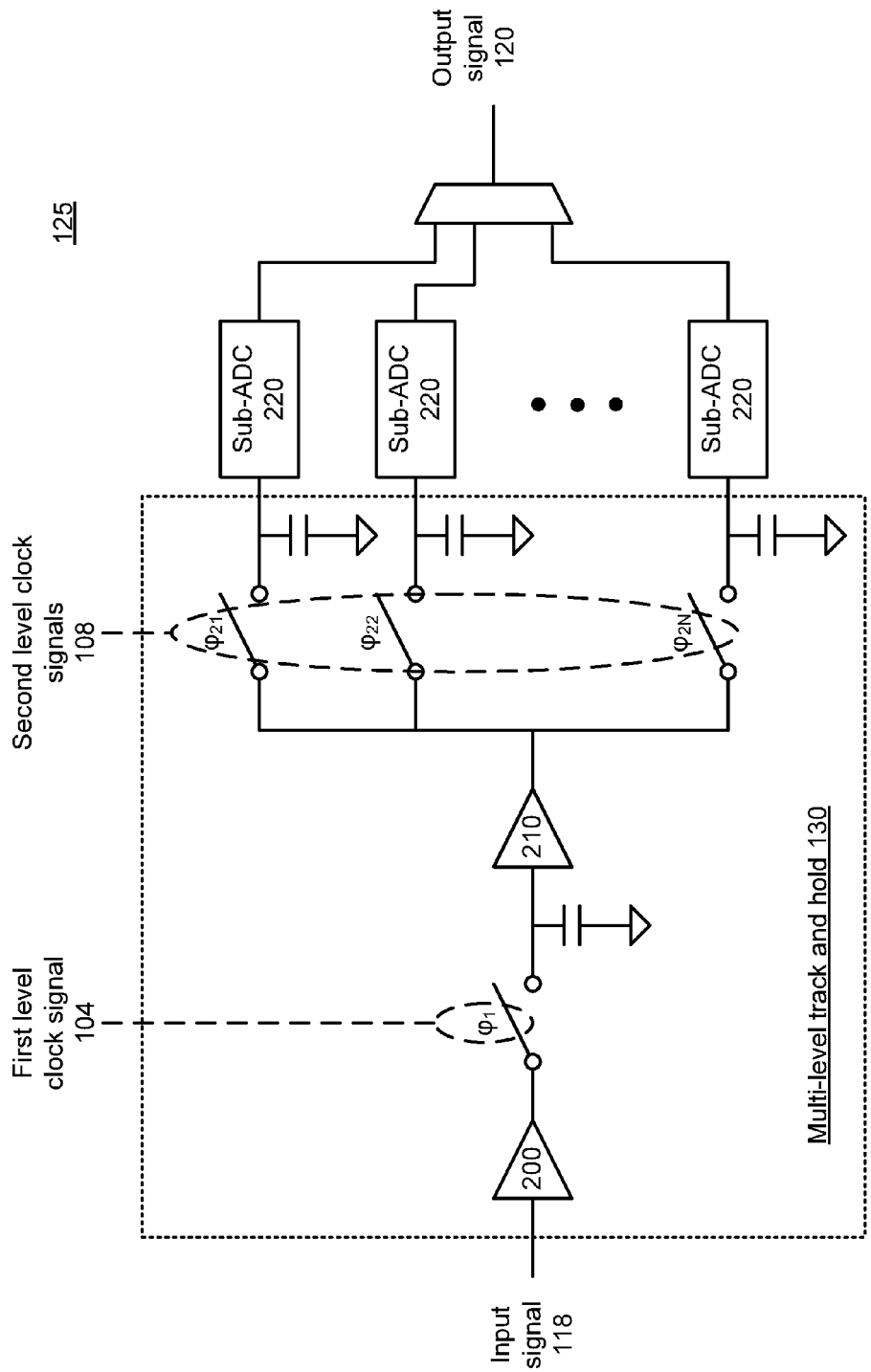
FIG. 2 presents a schematic/block diagram of an exemplary time-interleaved analog to digital convertor.

FIG. 2 presents a schematic/block diagram of an exemplary time-interleaved analog to digital convertor. In particular, an embodiment of time-interleaved ADC 125 is presented that includes a multi-level track and hold 130 and a plurality of sub-ADCs 220. The multi-level track and hold 130, as shown, includes two levels; however a greater number of levels can be included in other embodiments. In operation, the input signal 118 is sampled via a first level sample and hold circuit including a switch and a capacitor that is clocked via the first level clock signal 104. The first level clock signal 104 is represented by $\phi_1$. The first level sample and hold circuit is buffered by track and hold amplifier 200. The second level of the multi-level track and hold 130 includes track and hold amplifier 210 and a plurality of second level sample and hold circuits that are clocked by N second level clock signals 108 represented as ($\phi_{21}$, $\phi_{22}$ ... $\phi_{2N}$). The time interleaved ADC 125 further includes N sub-ADCs 220 whose outputs are digitally multiplexed together to generate the output signal 120.

As discussed in conjunction with FIG. 1, the first-level clock signal 104 should maintain low jitter to minimize degradation on ADC SNDR. While the second-level clock signals 108 do not require low jitter since the signal is already "frozen" by sampling at the first level, the second level clock signals should be non-overlap with the first-level clock signal 104.

In an embodiment, each of the second level clock signals 108 has a duty cycle that can be represented by DC, where $DC < (½N)$. For example, a value of the duty cycle, $DC = (¼N)$ can be employed to minimize the loading on track and hold amplifier (THA) 210, requiring the THA to support only one sub-ADC 220 at any given time.

Figure 3:
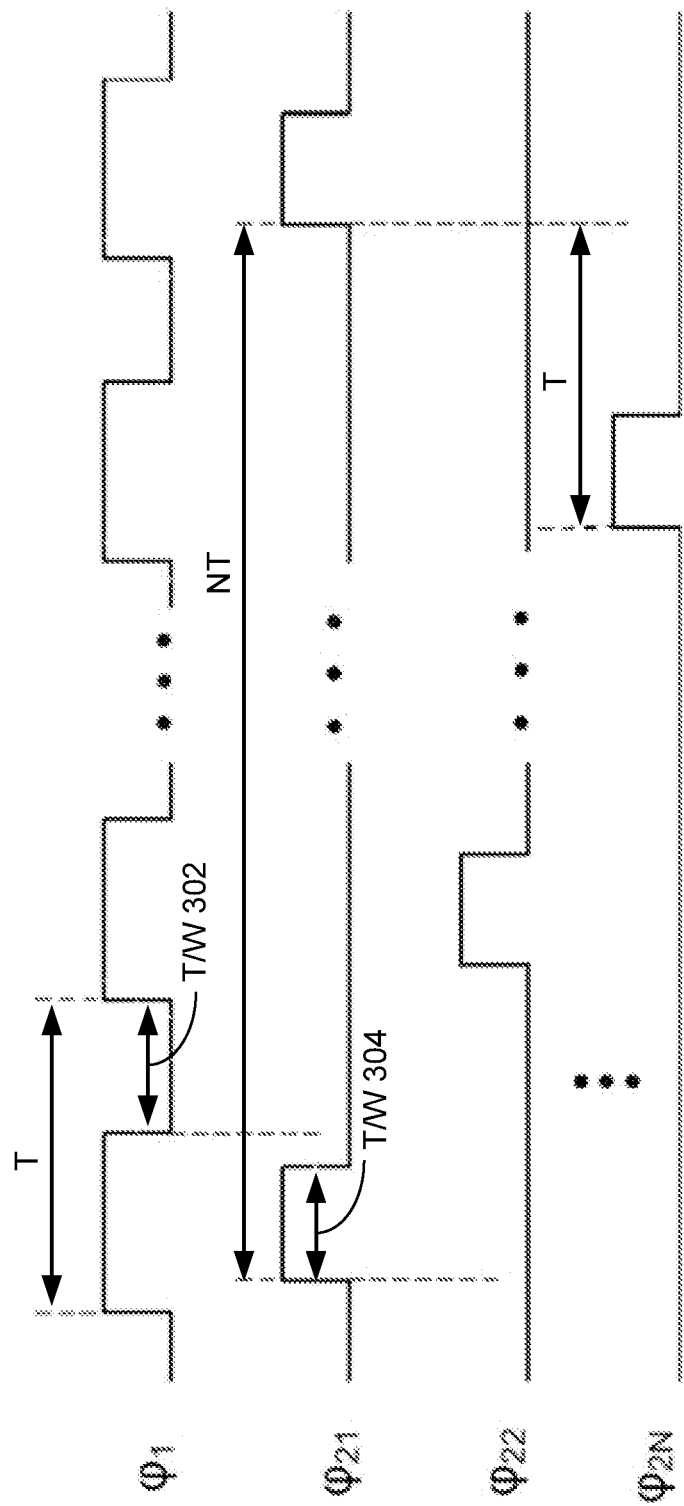
FIG. 3 presents an exemplary timing diagram.

FIG. 3 presents an exemplary timing diagram. In particular a timing diagram is presented that shows the relationship between the first level clock signal 104, $\phi_1$, and the N second level clock signals ($\phi_{21}, \phi_{22} \ldots \phi_{2N}$). The first level clock signal $\phi_1$, controls the first level track and hold to sample at one time window (T/W) 302 for each period T. Each of the N second level clock signals ($\phi_{21}, \phi_{22} \ldots \phi_{2N}$) sample at one time window (T/W) 304 over a longer period NT, on a time-interleaved basis—with only one of the N second level clock signals ($\phi_{21}, \phi_{22} \ldots \phi_{2N}$) sampling in each period T of the first level clock signal $\phi_1$. As shown further, a non-overlap relationship between $\phi_1$ and ($\phi_{21}, \phi_{22} \ldots \phi_{2N}$) is maintained. In an embodiment, higher priority is given to maintaining the non-overlap condition in the falling edges of ($\phi_{21}, \phi_{22} \ldots \phi_{2N}$), to maintain correct functionality.

Figure 4:
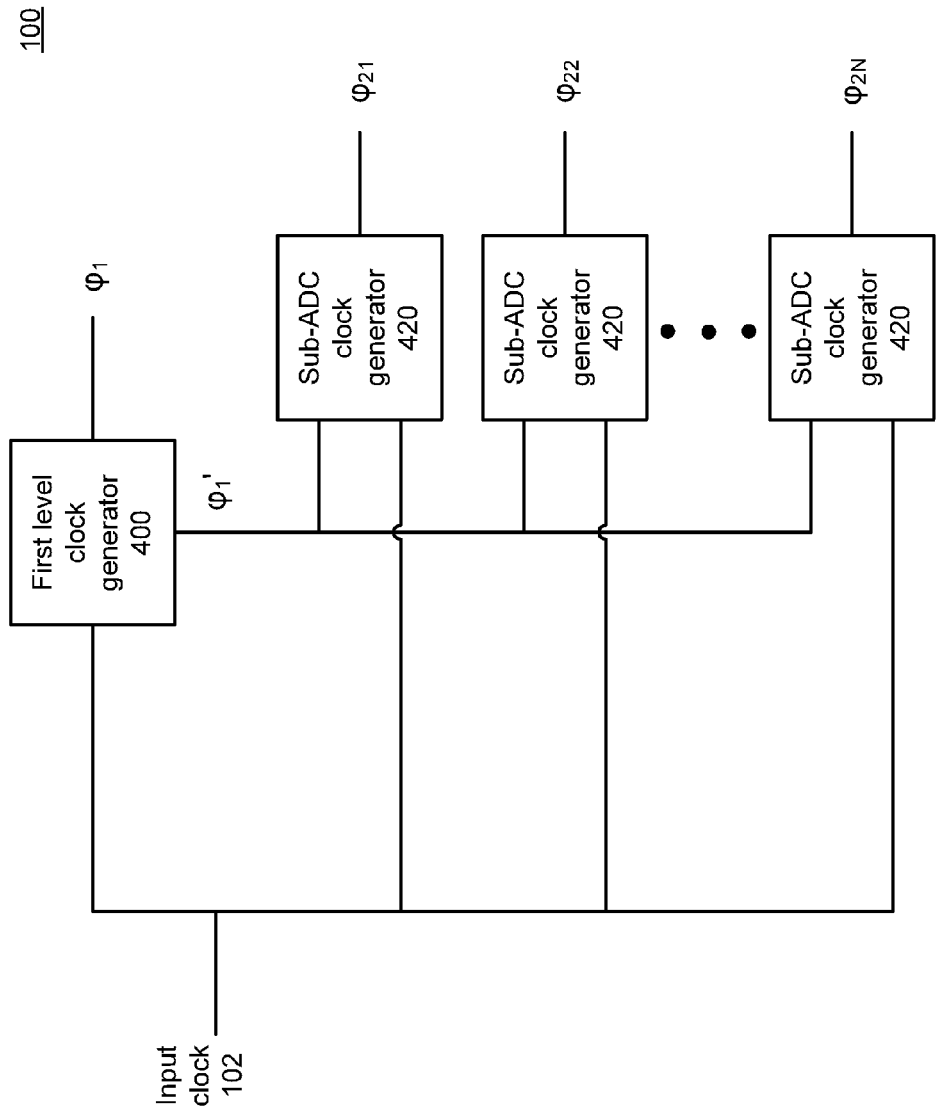
FIG. 4 presents a block diagram of an exemplary clock generator.

FIG. 4 presents a block diagram of an exemplary clock generator. In particular, an embodiment of clock generator 100 is presented that includes first level clock generator 400 and a plurality of sub-ADC clock generators 420.

First level clock generator 400 is configured to receive the input clock 102 from a time base, oscillator or other clock generator, and to generate the first level clock signal $\phi_1$. In addition, the first level clock generator 400 generates a time-leading version $\phi_1'$ of the first level clock signal $\phi_1$. For example, $$\phi_1'(t)=\phi_1(t-D4)$$

where, D4 represents the amount of time that $\phi_1'$ leads the first level clock signal $\phi_1$.

The N sub-ADC clock generators 420 are configured to receive the input clock 102 and generate N second clock signals ($\phi_{21}, \phi_{22} \ldots \phi_{2N}$). The N sub-ADC clock generators 420 operate based on the time-leading version $\phi_1'$ of the first level clock signal and on timing feedback to dynamically control the second clock signals ($\phi_{21}, \phi_{22} \ldots \phi_{2N}$) to avoid overlap conditions with the first level clock signal $\phi_1$.

Embodiments of the first level clock generator 400 and the sub-ADC clock generators 420, that include several optional functions and features, are presented in conjunction with FIGS. 5-9 that follow.

Figure 5:
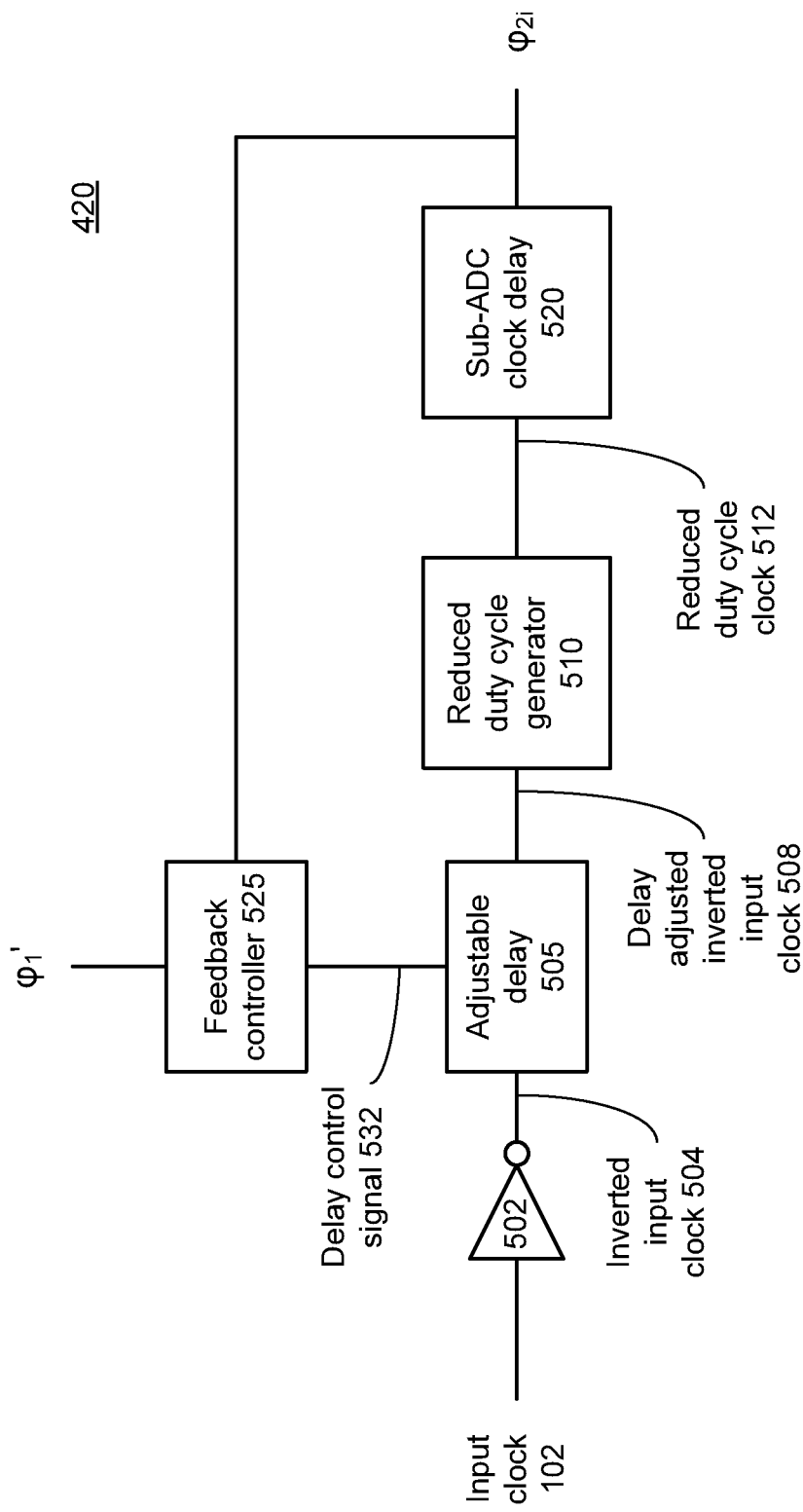
FIG. 5 presents a schematic/block diagram of an exemplary sub ADC clock generator.

FIG. 5 presents a schematic/block diagram of an exemplary sub ADC clock generator. In particular, an embodiment of a sub-ADC clock generator 420 is shown that includes an inverter 502, adjustable delay 505, reduced duty cycle generator 510, sub-ADC clock delay 520 and delay feedback controller 525.

In operation, the input clock 102 is inverted by inverter 502 to produce the inverted input clock 504. A controllable amount of time delay is applied by adjustable delay to generate delay adjusted inverted input clock 508. Reduced duty cycle generator 510 reduces the duty cycle, from one on-cycle per period T to correspond to a reduced duty cycle clock 512 with a single reduced on-cycle per period NT. Finally, the sub-ADC clock delay 520 provides an additional delay to align the on-cycle of the particular second level clock $\phi_{2i}$ with the ith period of the first level clock signal $\phi_1$.

Closed loop feedback is applied to further control time alignment of the second level clock $\phi_{2i}$ to the first level clock signal $\phi_1$. The feedback controller 525 is configured to generate a delay control signal 532, based on the time-leading version of the first clock signal $\phi_1'$ and further based on feedback of the second level clock signal $\phi_{2i}$. The adjustable delay delays the second level clock signal $\phi_{2i}$ by a delay amount that is determined based on a delay control signal 532. In operation, the feedback controller 525 controls a falling edge of the second level clock signal $\phi_{2i}$ to occur before a falling edge of the time-leading first level clock signal $\phi_1'$ and thus, before a falling edge of the first level clock signal $\phi_1$. In addition, the feedback controller 525 controls a rising edge of the second level clock signal $\phi_{2i}$ to occur after a rising edge of the time-leading first level clock signal $\phi_1'$.

It should be noted that while the elements of sub-ADC 420 are presented in a particular order, other orderings of these elements are likewise possible. Consider, for example, that the adjustable delay 505 could apply a time delay to the second level clock signal $\phi_{2i}$ at any point along the forward path from input clock 102.

It should also be noted that the present design, by using an adjustable delay in the signal path of the second level clocks avoids the insertion of additional and/or adjustable delay in the signal path of the first level clock circuit. This minimizes number of gates in the first level clock signal path to reduce clock jitter and improves the ADC SNDR, which can be important to many designs.

Figure 6:
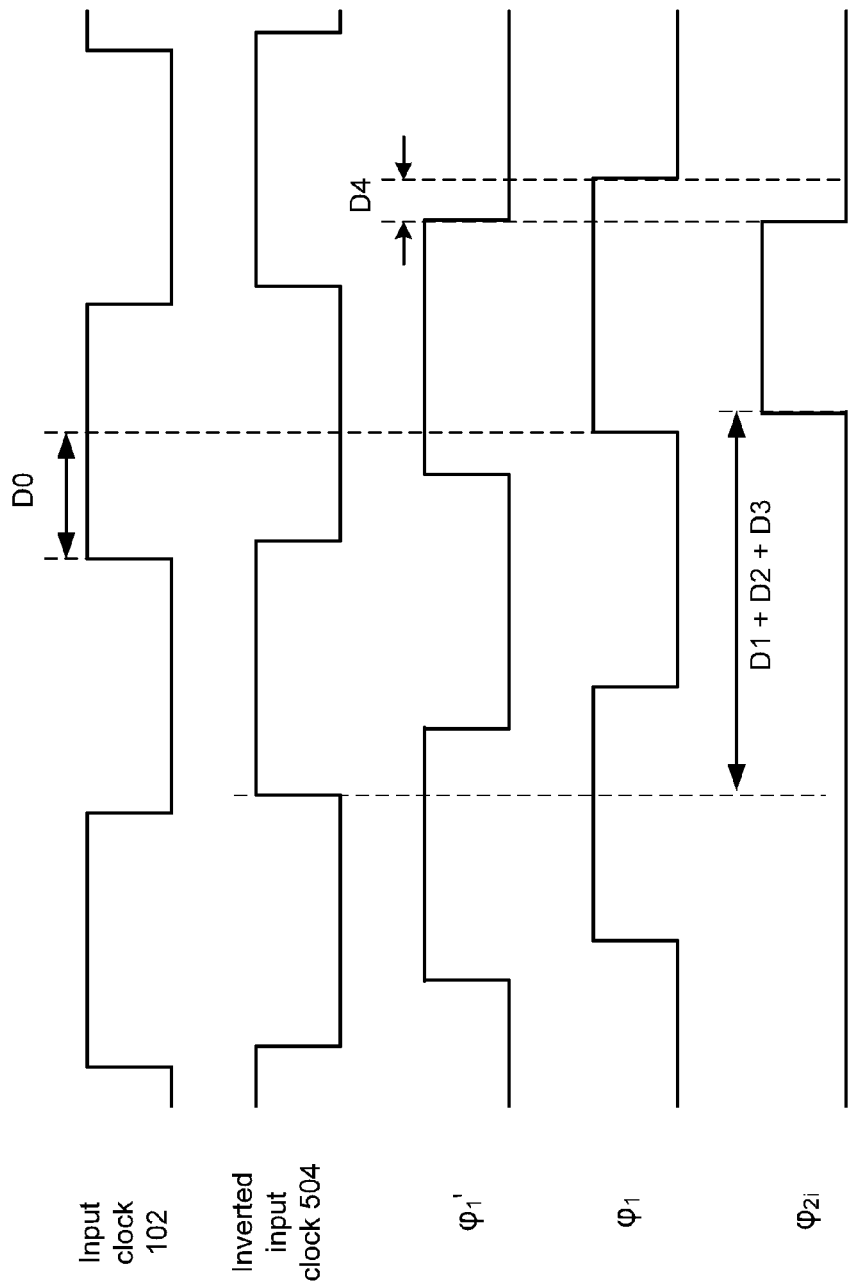
FIG. 6 presents an exemplary timing diagram.

FIG. 6 presents an exemplary timing diagram. In particular, an embodiment of timing for input clock 102, inverted input clock 504, the time-leading version of the first clock signal $\phi_1'$, the first level clock signal $\phi_1$ and the second level clock signal $\phi_{2i}$ are presented. As shown, the first level clock signal $\phi_1$ is delayed from the input clock 102 by an amount D0, and the time-leading version of the first clock signal $\phi_1'$, is delayed by a lessor amount (D0-D4).

The second level clock signal $\phi_{2i}$ is generated based on the inverted input clock 504 and by applying an adjustable delay D1 (505), fixed delay D2 corresponding to delay introduced by reduced duty cycle generator 510 and a further fixed delay due to sub-ADC clock delay 520. The adjustable delay D1 is controlled based on feedback and the time-leading first level clock signal $\phi_1'$ to maintain a robust non-overlap relationship, over variations of process voltage and temperature, between the first level clock signal $\phi_1$ and the second level clock signal $\phi_{2i}$.

Figure 7:
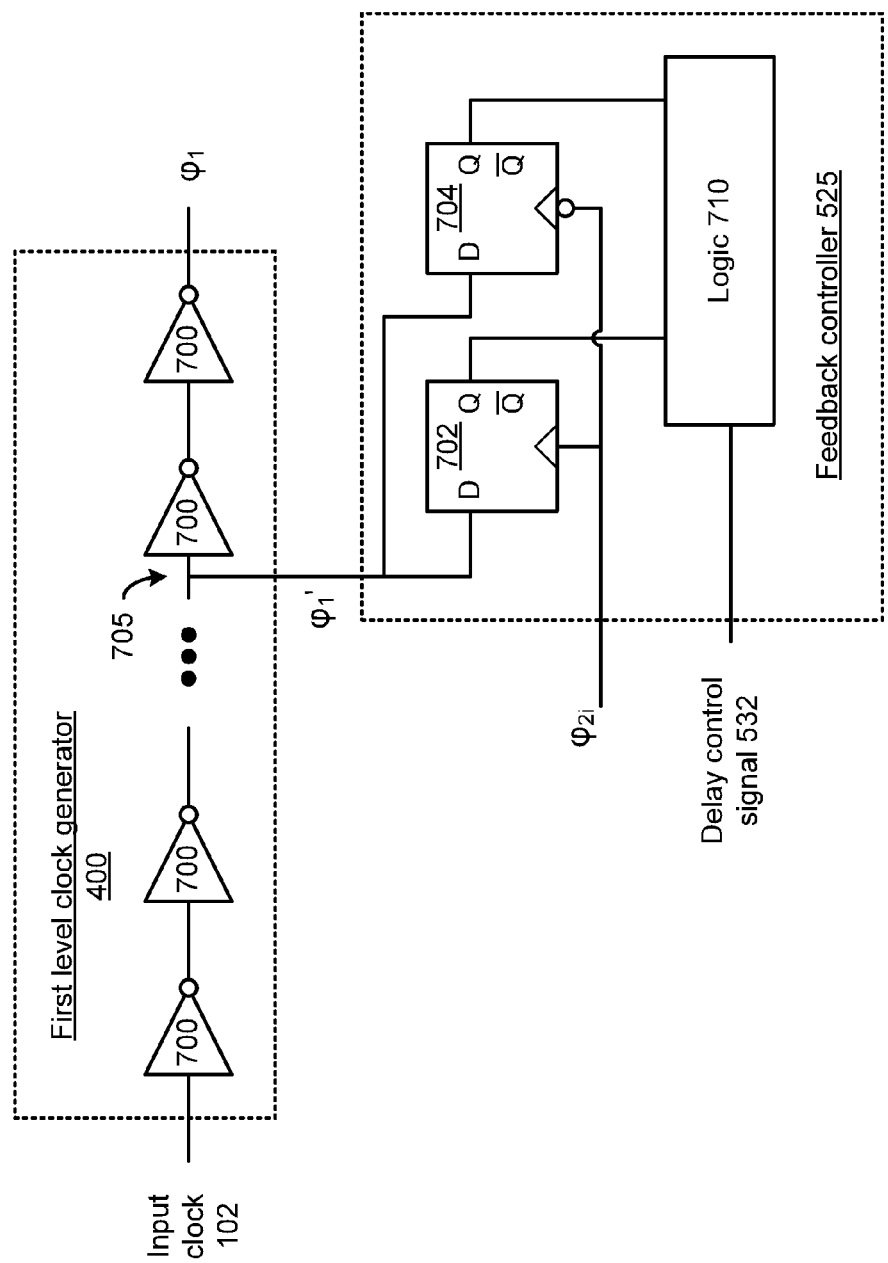
FIG. 7 presents a schematic/block diagram of an exemplary first level clock generator and feedback controller.

FIG. 7 presents a schematic/block diagram of an exemplary first level clock generator and feedback controller. In particular, an embodiment of first level clock generator 400 and feedback controller 525 is presented. The first level clock generator 400 includes a delay line having a plurality of delay elements, each represented by two inverters 700 (to preserve phase), and a tap 705 that is one delay element prior to the output. The first level clock signal $\phi_1$ is generated at the output of the delay line and the time-leading version of the first level clock signal $\phi_1'$ is generated at the tap 705. While the tap 705 is shown one delay element from the output, a greater amount of delay D4 could be used by including additional delay elements after the tap 705. Further while the delay elements are shown as inverters, other circuit elements could likewise be employed.

The feedback controller 525 includes a flip-flop 702 that is triggered by a rising edge of the second level clock signal $\phi_{2i}$. The flip-flop 702 captures a first value of the time-leading version of the first level clock signal $\phi_1'$. The flip-flop 704 is triggered by a falling edge of the second level clock signal $\phi_{2i}$. The flip-flop 704 captures a second value of the time-leading version of the first level clock signal $\phi_1'$. Logic 710 generates the delay control signal 532 to indicate one of: a command to increase the delay amount, a command to maintain the delay amount and a command to decrease the delay amount. The logic 710 can be implemented via logic gates, a processing unit or other circuit. In particular, the values captured by the flip-flops 702 and 704 can be used by logic 710 to indicate whether the second level clock signal $\phi_{2i}$ has proper timing or needs to be adjusted as follows.

If the values of flip-flops 702 and 704 are (1, 1) respectively—this means that the on-cycle of the second level clock signal $\phi_{2i}$ is aligned with the on-cycle of time-leading version of the first level clock signal $\phi_1'$ and, by implication, the falling edge of the second level clock signal $\phi_{2i}$ appears before the falling edge of the first level clock signal $\phi_1$. In this case, the logic 710 can generate a delay control signal 532 to maintain the delay amount.

If the values of flip-flops 702 and 704 are (1, 0) respectively—this means that the falling edge of the second level clock signal $\phi_{2i}$ does not appear before the falling edge of the time-leading version of the first level clock signal $\phi_1'$. In this case, the logic 710 can generate a delay control signal 532 to decrease the delay amount to avoid a condition where the falling edge of the second level clock signal $\phi_{2i}$ does not appear before the falling edge of the first level clock signal $\phi_1$.

If the values of flip-flops 702 and 704 are (0, 1) respectively—this means that the rising edge of the second level clock signal $\phi_{2i}$ appears before the rising edge of the time-leading version of the first level clock signal $\phi_1'$. In this case, the logic 710 can generate a delay control signal 532 to increase the delay amount to realign the on-cycle of the second level clock signal $\phi_{2i}$ with the on-cycle of time-leading version of the first level clock signal $\phi_1'$.

Figure 8:
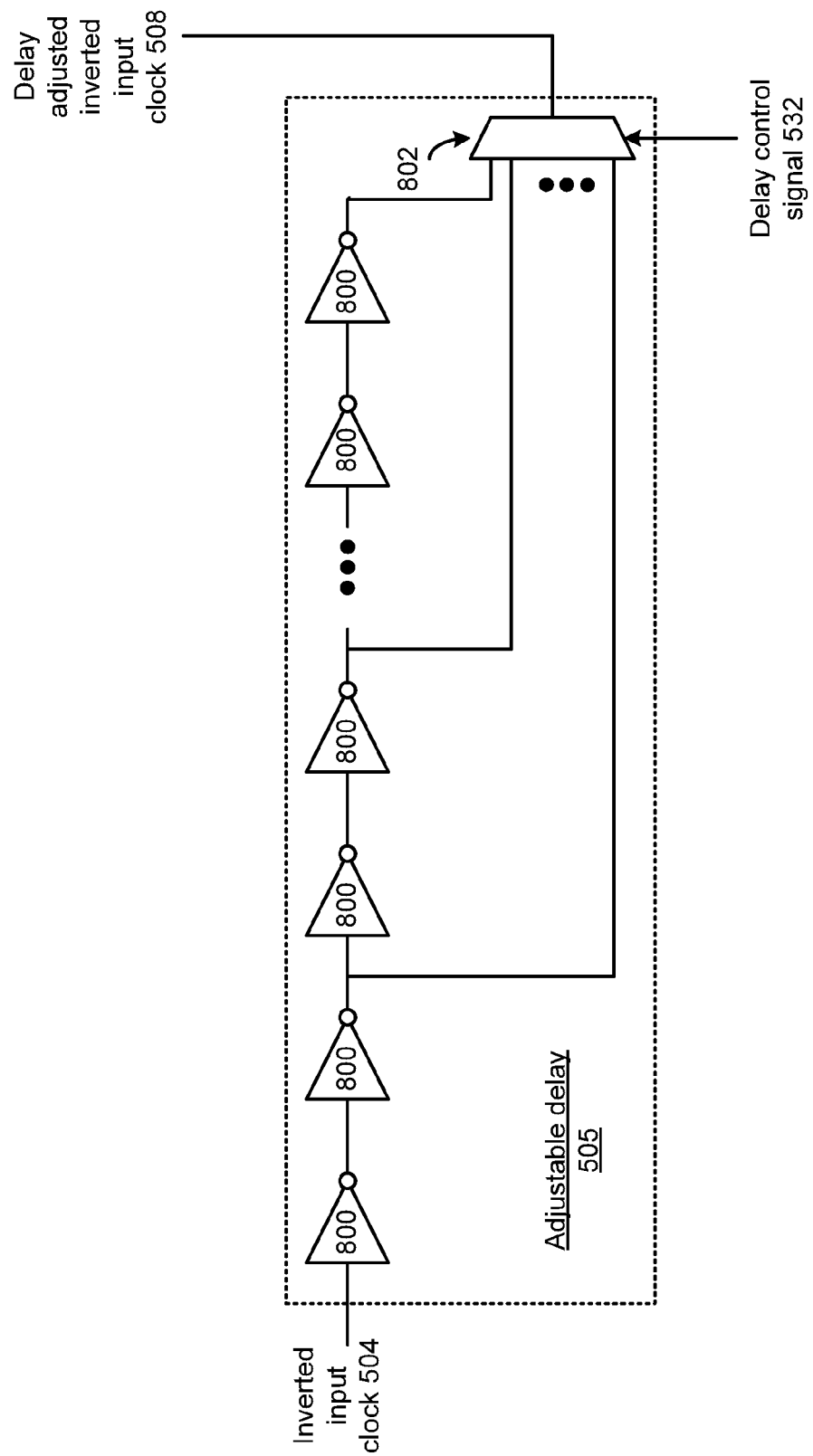
FIG. 8 presents a schematic/block diagram of an exemplary adjustable delay.

FIG. 8 presents a schematic/block diagram of an exemplary adjustable delay. In particular, an adjustable delay 505 is presented that includes a delay line having a plurality of delay elements to delay the inverted input clock 504. The delay elements are each represented by two inverters 800 to preserve phase. The delay line includes a plurality of taps. A multiplexer 802 generates the delay adjusted inverted input clock 508 output from a selected tap. In particular, the multiplexer 802 operates based on delay control signal 532 to, for example, increase the delay, maintain the delay or decrease the delay by selecting appropriate taps. Further while the delay elements are shown as inverters, other circuit elements could likewise be employed.

Figure 9:
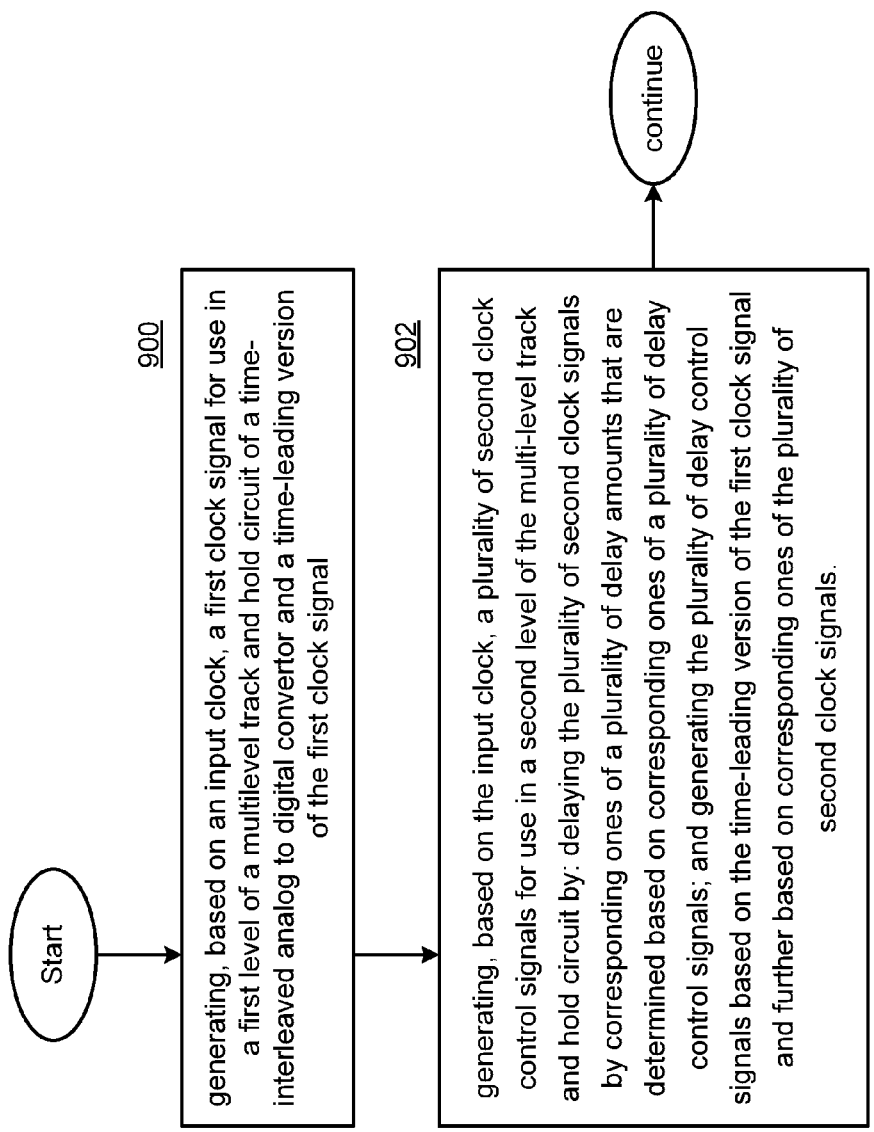
FIG. 9 presents a flowchart representation of an exemplary method.

FIG. 9 presents a flowchart representation of an exemplary method. In particular, a method is presented for use in conjunction with one or more functions and features described in conjunction with FIGS. 1-8. Step 900 includes generating, based on an input clock, a first clock signal for use in a first level of a multilevel track and hold circuit of a time-interleaved analog to digital convertor and a time-leading version of the first clock signal. Step 902 includes generating, based on the input clock, a plurality of second clock signals for use in a second level of the multi-level track and hold circuit by: delaying the plurality of second clock signals by corresponding ones of a plurality of delay amounts that are determined based on corresponding ones of a plurality of delay control signals; and generating the plurality of delay control signals based on the time-leading version of the first clock signal and further based on corresponding ones of the plurality of second clock signals.

In an embodiment, the plurality of delay control signals are generated to control a falling edge of the corresponding one of the plurality of second clock signals to occur before a falling edge of the first clock signal. The plurality of delay control signals can be generated to control a rising edge of the corresponding one of the plurality of second clock signals to occur after a rising edge of the first clock signal. The plurality of delay control signals can be generated to indicate one of: a command to increase the delay amount, a command to maintain the delay amount and a command to decrease the delay amount.

Various embodiment have been presented herein that minimize number of gates in the first level clock signal path to reduce clock jitter and improve the ADC SNDR which can be important to many designs. Timing control is implemented with little additional power overhead. The extra circuitry for phase adjustment includes two D flip-flops and simple digital logic. In addition, the control mechanism is flexible and expandable and can easily adapt to different numbers of time-interleaved ADC branches.

In addition, the feedback loop generates a non-overlap condition over process/voltage/temperature variations, providing a versatile and robust system solution. Further the use of closed loop feedback allows wider tracking windows to be employed in the second level of the multi-level track and hold 130, allowing greater scalability.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A clock generator comprising:
a first clock generator configured to receive an input clock, to generate a first clock signal for use in a first level of a multilevel track and hold circuit of a time-interleaved analog to digital convertor and to generate a time-leading version of the first clock signal;
a plurality of second clock generators configured to receive the input clock and generate a corresponding plurality of second clock signals for use in a second level of the multi-level track and hold circuit, wherein the plurality of second level clock generators include:
an adjustable delay that delays a corresponding one of the plurality of second clock signals by a delay amount that is determined based on a delay control signal; and
a feedback controller, coupled to the adjustable delay, configured to generate the delay control signal based on the time-leading version of the first clock signal and further based on the corresponding one of the plurality of second clock signals.

2. The clock generator of claim 1 wherein the feedback controller controls a falling edge of the corresponding one of the plurality of second clock signals to occur before a falling edge of the first clock signal.

3. The clock generator of claim 1 wherein the feedback controller controls a rising edge of the corresponding one of the plurality of second clock signals to occur after a rising edge of the first clock signal.

4. The clock generator of claim 1 wherein the feedback controller includes a first flip-flop triggered by a rising edge of the corresponding one of the plurality of second clock signals that captures a first value of the time-leading version of the first clock signal.

5. The clock generator of claim 4 wherein the feedback controller further includes a second flip-flop triggered by a falling edge of the corresponding one of the plurality of second clock signals that captures a second value of the time-leading version of the first clock signal.

6. The clock generator of claim 5 wherein the feedback controller further includes logic that generates the delay control signal to indicate one of: a command to increase the delay amount, a command to maintain the delay amount and a command to decrease the delay amount.

7. The clock generator of claim 1 wherein the plurality of second clock generators generate the corresponding plurality of second clock control signals based on an inversion of the input clock.

8. The clock generator of claim 1 wherein the first clock generator includes a delay line having a plurality of delay elements and a tap at least one delay element prior to the output and wherein the first clock signal is generated at the output of the delay line and the time-leading version of the first clock signal is generated at the tap.

9. A method comprising:
generating, based on an input clock, a first clock signal for use in a first level of a multilevel track and hold circuit of a time-interleaved analog to digital convertor and a time-leading version of the first clock signal;
generating, based on the input clock, a plurality of second clock signals for use in a second level of the multi-level track and hold circuit by:
delaying the plurality of second clock signals by corresponding ones of a plurality of delay amounts that are determined based on corresponding ones of a plurality of delay control signals; and
generating the plurality of delay control signals based on the time-leading version of the first clock signal and further based on corresponding ones of the plurality of second clock signals.

10. The method of claim 9 wherein the plurality of delay control signals are generated to control a falling edge of the corresponding one of the plurality of second clock signals to occur before a falling edge of the first clock signal.

11. The method of claim 9 wherein the plurality of delay control signals are generated to control a rising edge of the corresponding one of the plurality of second clock signals to occur after a rising edge of the first clock signal.

12. The method of claim 9 wherein the plurality of delay control signals are generated to indicate one of: a command to increase the delay amount, a command to maintain the delay amount and a command to decrease the delay amount.

13. The method of claim 9 wherein the plurality of second clock control signals is generated based on an inversion of the input clock.

14. A clock generator comprising:
a first clock generator configured to receive an input clock, to generate a first clock signal for use in a first level of a multilevel track and hold circuit of a time-interleaved analog to digital convertor, wherein the first clock generator includes a delay line having a plurality of delay elements and a tap at least one delay element prior to the output and wherein the first clock signal is generated at the output of the delay line and a time-leading version of the first clock signal is generated at the tap;
a plurality of second clock generators configured to receive the input clock and generate a corresponding plurality of second clock signals for use in a second level of the multi-level track and hold circuit, wherein the plurality of second level clock generators include:
an adjustable delay that delays a corresponding one of the plurality of second clock signals by a delay amount that is determined based on a delay control signal; and
a feedback controller, coupled to the adjustable delay, configured to generate the delay control signal based on the time-leading version of the first clock signal and further based on the corresponding one of the plurality of second clock signals.

15. The clock generator of claim 14 wherein the feedback controller controls a falling edge of the corresponding one of the plurality of second clock signals to occur before a falling edge of the first clock signal.

16. The clock generator of claim 14 wherein the feedback controller controls a rising edge of the corresponding one of the plurality of second clock signals to occur after a rising edge of the first clock signal.

17. The clock generator of claim 14 wherein the feedback controller includes a first flip-flop triggered by a rising edge of the corresponding one of the plurality of second clock signals that captures a first value of the time-leading version of the first clock signal.

18. The clock generator of claim 17 wherein the feedback controller further includes a second flip-flop triggered by a falling edge of the corresponding one of the plurality of second clock signals that captures a second value of the time-leading version of the first clock signal.

19. The clock generator of claim 18 wherein the feedback controller further includes logic that generates the delay control signal to indicate one of: a command to increase the delay amount, a command to maintain the delay amount and a command to decrease the delay amount.

20. The clock generator of claim 14 wherein the plurality of second clock generators generate the corresponding plurality of second clock control signals based on an inversion of the input clock.

* * * * *

UNITED STATES PATENT AND TRADEMARK OFFICE
CERTIFICATE OF CORRECTION

PATENT NO.        : 8,902,094 B1                              Page 1 of 1
APPLICATION NO.   : 14/087457
DATED             : December 2, 2014
INVENTOR(S)       : Heng Zhang et al.

It is certified that error appears in the above-identified patent and that said Letters Patent is hereby corrected as shown below:

In the Claims

Col. 9, lines 2-3, in claim 8: after "having a plurality of delay elements and a tap at" insert --at--

Col. 9, lines 43-44, in claim 14: after "having a plurality of delay elements and a tap at" insert --at--

Signed and Sealed this
Twenty-third Day of February, 2016

Michelle K. Lee
*Director of the United States Patent and Trademark Office*